(12) United States Patent
Stricklin

(10) Patent No.: US 8,013,456 B2
(45) Date of Patent: Sep. 6, 2011

(54) MOLDED BEAM FOR OPTOELECTRONIC SENSOR CHIP SUBSTRATE

(75) Inventor: Robert S. Stricklin, Richardson, TX (US)

(73) Assignee: Texas Advanced Optoelectronic Solutions, Inc., Plano, TX (US)

( * ) Notice: Subject to any disclaimer, the term of this patent is extended or adjusted under 35 U.S.C. 154(b) by 213 days.

(21) Appl. No.: 12/032,805

(22) Filed: Feb. 18, 2008

(65) Prior Publication Data
US 2008/0224334 A1   Sep. 18, 2008

Related U.S. Application Data

(60) Provisional application No. 60/891,238, filed on Feb. 23, 2007.

(51) Int. Cl.
H01L 23/29 (2006.01)

(52) U.S. Cl. ............... 257/793; 257/787; 257/E21.502; 257/E23.119

(58) Field of Classification Search .................. 257/787, 257/793, E21.502, E23.119
See application file for complete search history.

(56) References Cited

U.S. PATENT DOCUMENTS

2006/0189160 A1* 8/2006 Hattori et al. ................. 438/780
2007/0087512 A1* 4/2007 Cho et al. ..................... 438/381

* cited by examiner

Primary Examiner — Andy Huynh
(74) Attorney, Agent, or Firm — Howison & Arnott, L.L.P.

(57) ABSTRACT

A substrate on which a plurality of epoxy over molded integrated circuit dies are formed includes a beam formed on the substrate for providing stiffness to the substrate. The beam includes structure having a cross-sectional shape, for example, substantially in the shape of a trapezoid, "T" or "L", and may be formed on the top or bottom surface of the substrate.

6 Claims, 4 Drawing Sheets

MOLDED BEAM FOR OPTOELECTRONIC SENSOR CHIP SUBSTRATE

RELATED APPLICATION

The present application claims the benefit of U.S. Provisional Patent Application Ser. No. 60/891,238 filed Feb. 23, 2007 entitled "Molded Beam for Optoelectronic Sensor".

TECHNICAL FIELD OF THE INVENTION

The present invention relates to integrated circuits, and more particularly to integrated circuit fabrication.

BACKGROUND OF THE INVENTION

Integrated circuits such as, for example, optoelectronic sensors, are typically manufactured as packages in multiple quantities formed from "chips" fabricated on printed circuit boards. These packages are constructed by forming integrated circuit dies on a FR4 printed circuit board or Bismaleimide-Thriazine (BT) substrates. The die is wire bonded with, for example, gold wire and then over molded with epoxy to protect the die and the wire bonds. The substrate is then cut into small pieces using a sawing process to form individual integrated circuit packages.

The over mold process utilizes a transfer molded epoxy material. The epoxy material and the substrate on which the integrated circuit dies are formed, have different thermal coefficient of expansions. The combination of the epoxy material and the substrate and the tooling design methods utilized, create large stresses in the individual integrated circuit packages. Stresses in the individual packages are caused by the difference in thermal coefficient of expansion between the mold epoxy and the substrate. The stresses cause the substrate to curl after over molding. As a result of the curling, fixturing is necessary to flatten the substrate prior to the sawing operation.

A need has thus arisen for a substrate and fabrication process which provides additional strength for the substrate to prevent undesired curling of the substrate prior to a sawing operation.

SUMMARY OF THE INVENTION

In accordance with the present invention, a substrate on which a plurality of epoxy over molded integrated circuit dies are formed includes a beam formed on the substrate for providing stiffness to the substrate. The beam includes structure having a cross-sectional shape, for example, substantially in the shape of a trapezoid, "T" or "L", and may be formed on the top or bottom surface of the substrate.

BRIEF DESCRIPTION OF THE DRAWINGS

For a more complete understanding of the present invention and for further advantages thereof, reference is now made to the following Description of the Preferred Embodiments taken in conjunction with the accompanying Drawings.

DESCRIPTION OF THE PREFERRED EMBODIMENTS

Figure 1:
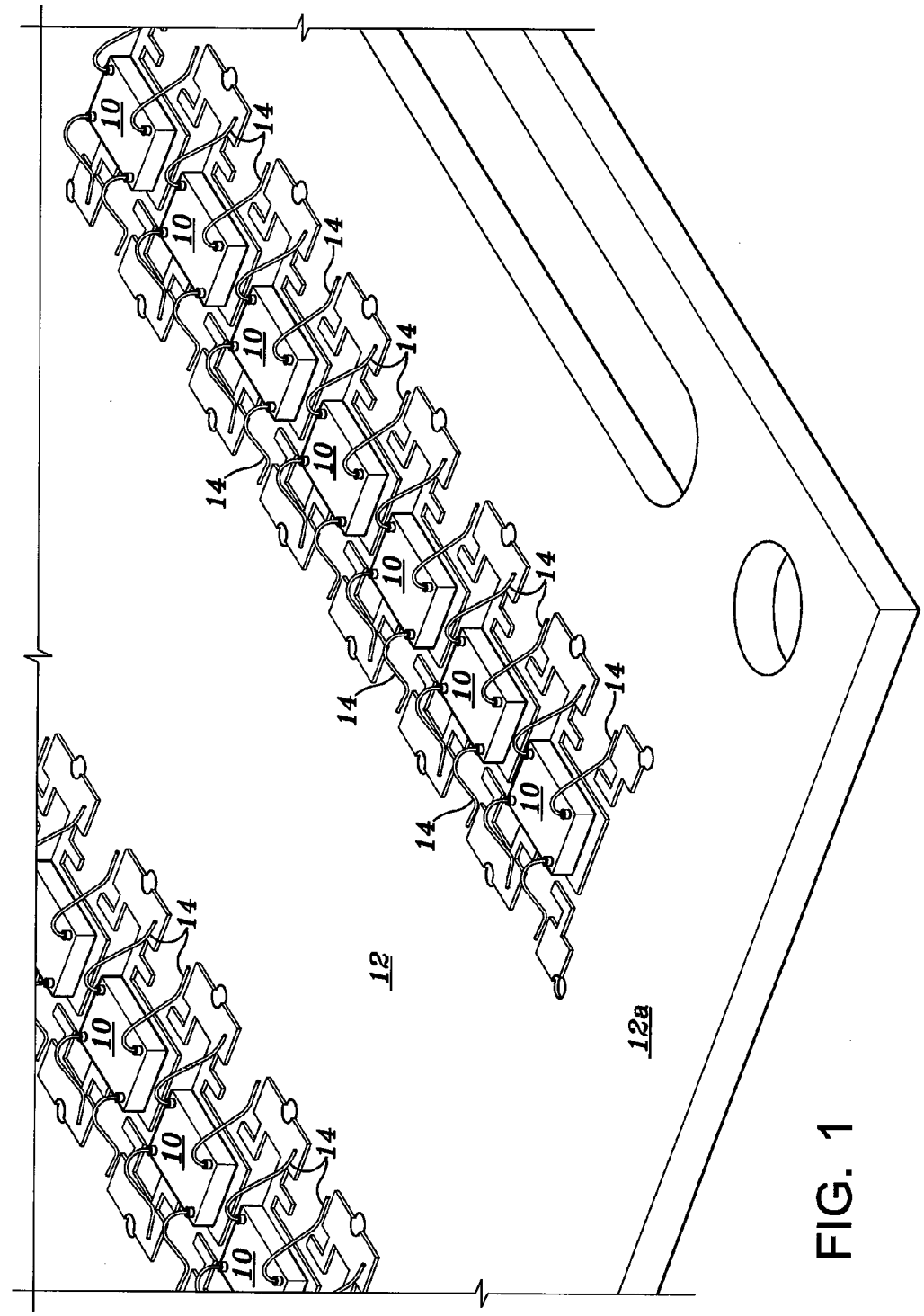
FIG. 1 is a pictorial illustration showing a plurality of dies on a substrate.
Figure 7:
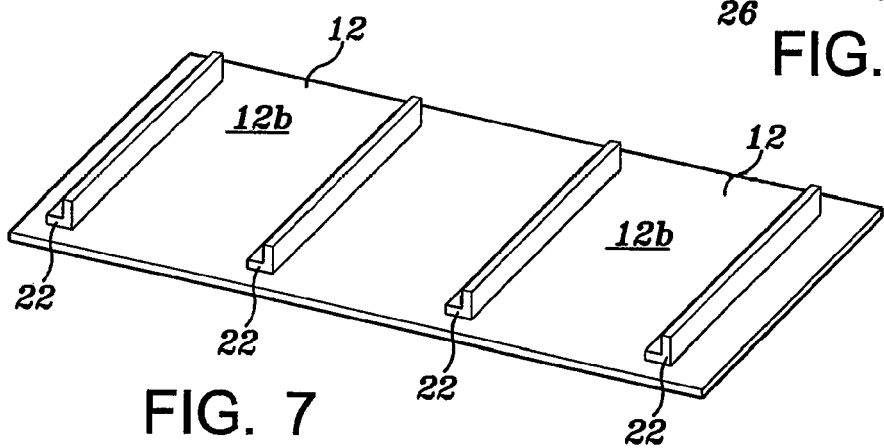
FIG. 7 is a pictorial illustration of the present beam formed on the bottom surface of a substrate.

Referring to the FIG. 1, a plurality of individual integrated circuit dies 10 are shown fabricated on a substrate 12, having a top surface 12a and a bottom surface 12b (FIG. 7). Substrate 12 may comprise, for example, a FR4 or BT substrate. Dies 10 are wire bonded utilizing wires 14.

Figure 2:
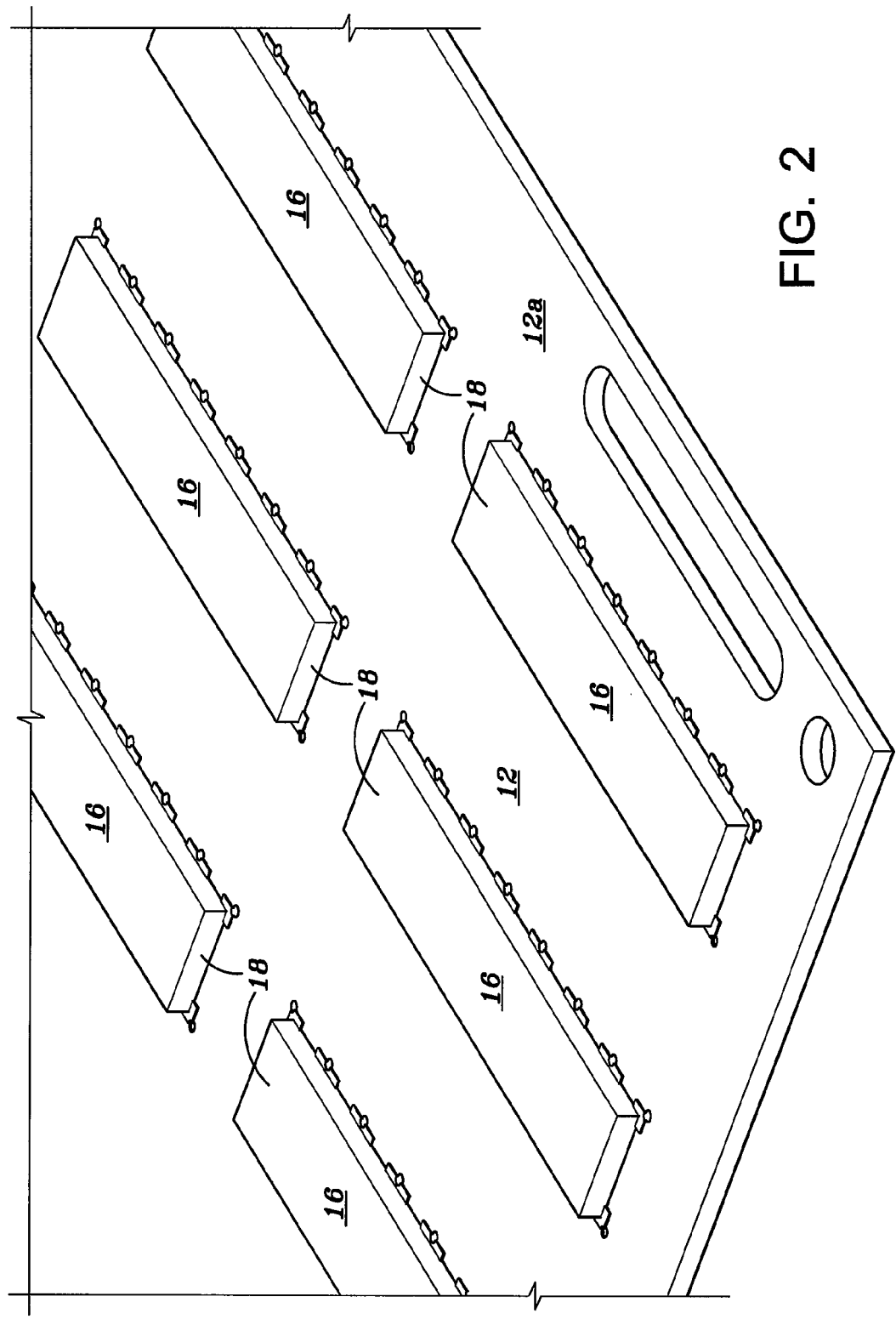
FIG. 2 is a pictorial illustration showing epoxy over molded dies on a substrate.

FIG. 2 illustrates dies 10 and wires 14 being over molded with epoxy 18 to form integrated circuit packages 16. Epoxy 18 may comprise for example, thermoset epoxy plastic molding compound materials.

Figure 3:
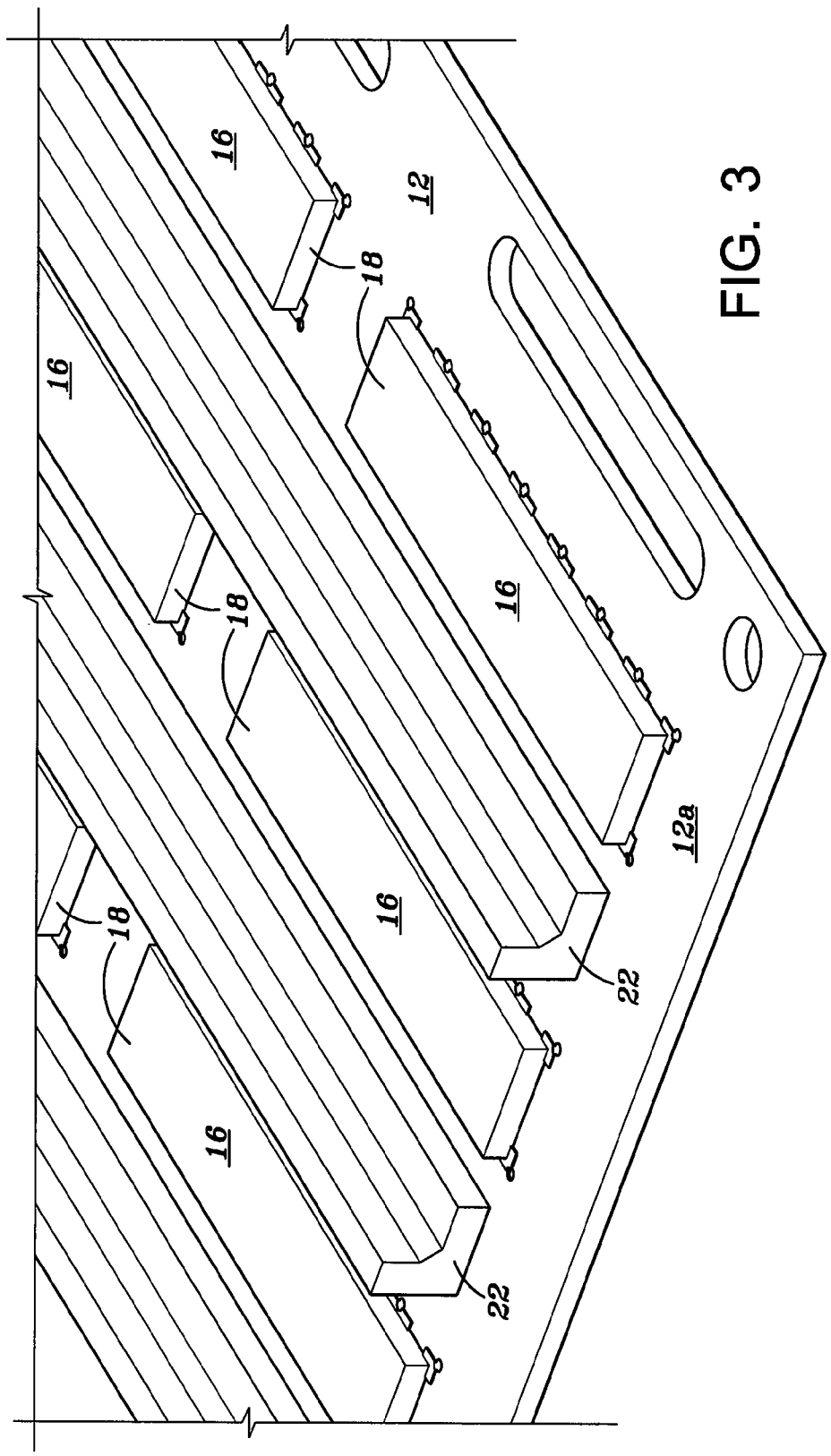
FIG. 3 is a pictorial illustration showing use of the present beam molded on the top surface of a substrate.

Referring now to FIG. 3, an embodiment of the present stiffening beam 22 is illustrated. Beam 22 is formed having a cross-sectional shape substantially in the form of the letter "L", and is formed on top surface 12a of substrate 12 adjacent to packages 16. Beam 22 is formed from the same epoxy 18 which over molds dies 10 and wires 14. Beam 22 adds sufficient strength to stabilize substrate 12 thereby preventing substrate 12 from curling prior to the saw operation. Beam 22 is formed in the fabrication process at about the same time as the over molding process of dies 10 takes place.

Figure 4:
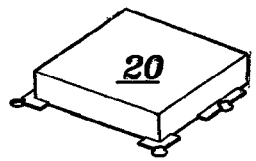
FIG. 4 is a pictorial illustration showing an individual component severed from a substrate.

FIG. 4 illustrates a single package 20 after the sawing operation which severs packages 16 from substrate 12. During the sawing operation, beam 22 is discarded.

Figure 5:
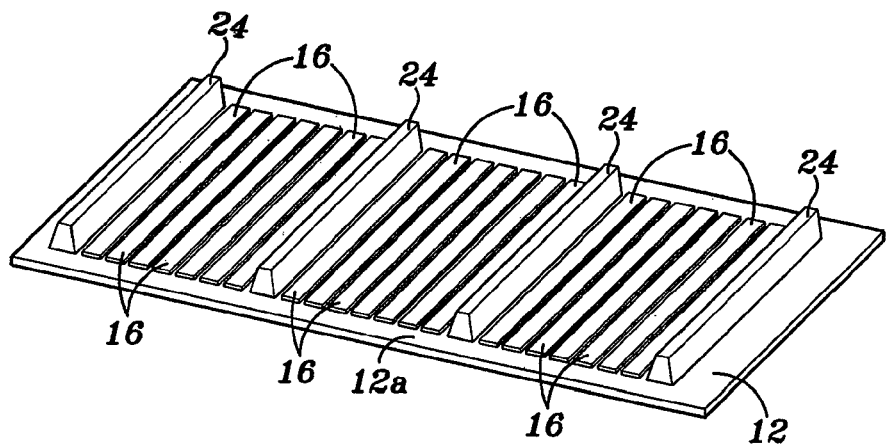
FIG. 5 is a pictorial illustration of an alternate embodiment of the present beam.
Figure 6:
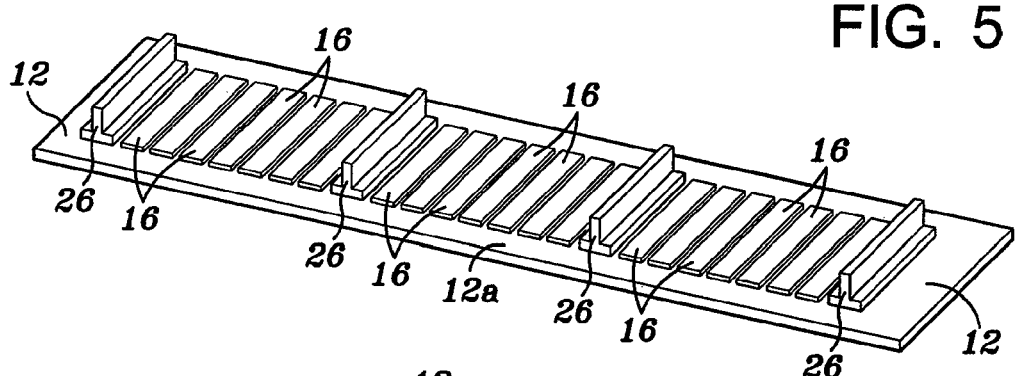
FIG. 6 is a pictorial illustration of an alternate embodiment of the present beam.

FIGS. 5 and 6 illustrate additional embodiments of the present beam. FIG. 5 illustrates a beam 24 having a cross-sectional shape substantially in the form of a trapezoid. FIG. 6 illustrates a beam 25 formed having a cross-sectional shape substantially in the form of the letter "T".

FIG. 7 illustrates the use of beam 22 formed on bottom surface 12b of a substrate 12.

Other alterations and modifications of the invention will likewise become apparent to those of ordinary skill in the art upon reading the present disclosure, and it is intended that the scope of the invention disclosed herein be limited only by the broadest interpretation of the appended claims to which the inventors are legally entitled.

I claim:

1. A substrate comprising:
   a substantially planar sheet having a top surface and a bottom surface;
   a plurality of epoxy over molded integrated circuit dies formed on the top surface of the sheet, wherein the epoxy over molded integrated circuit dies are separated from each other by a portion of the top surface defining an open area of the sheet between each pair of the epoxy over molded integrated circuit dies; and
   an epoxy formed beam molded on the open area of the top surface of the sheet between at least one of the pairs of epoxy over molded integrated circuit dies, wherein the epoxy formed beam is separated from each of the epoxy over molded integrated circuit dies by a visible portion of the open area of the sheet, and wherein the epoxy formed beam is formed only from the epoxy forming the epoxy over molded integrated circuit dies.

2. The substrate of claim 1 wherein the epoxy formed beam has a length and a width, wherein each of the epoxy over molded integrated circuit dies has a length and a width, and wherein the length of the epoxy formed beam is substantially parallel to the length of the epoxy over molded integrated circuit dies.

3. The substrate of claim 1 wherein the epoxy formed beam has a length and a width, wherein each of the epoxy over molded integrated circuit dies has a length and a width, and wherein the length of the epoxy formed beam is substantially identical to the length of the epoxy over molded integrated circuit dies.

4. The substrate of claim 1 wherein the epoxy formed beam has a length and a width, wherein each of the epoxy over molded integrated circuit dies has a length and a width, and wherein the length of the epoxy formed beam is greater than the length of the epoxy over molded integrated circuit dies.

5. A process comprising:
   selecting a substantially planar sheet having a top surface and a bottom surface;
   forming a plurality of epoxy over molded integrated circuit dies on the top surface of the sheet, wherein the forming separates the epoxy over molded integrated circuit dies from each other by a portion of the top surface defining an open area of the sheet between each pair of the epoxy over molded integrated circuit dies; and
   molding an epoxy formed beam on the open area of the top surface of the sheet between at least one of the pairs of epoxy over molded integrated circuit dies, wherein the molding separates the epoxy formed beam from each of the epoxy over molded integrated circuit dies by a visible portion of the open area of the sheet, and wherein the epoxy formed beam is formed only from the epoxy forming the epoxy over molded integrated circuit dies.

6. The process of claim 5 wherein the epoxy formed beam is not formed simultaneously with the epoxy over molded integrated circuit dies.

* * * * *